US007606694B1

(12) United States Patent
Carrillo et al.

(10) Patent No.: US 7,606,694 B1
(45) Date of Patent: Oct. 20, 2009

(54) FRAMEWORK FOR CYCLE ACCURATE SIMULATION

(75) Inventors: Jorge Ernesto Carrillo, San Jose, CA (US); Satish R. Ganesan, Mountain View, CA (US); Amit Kasat, Cupertino, CA (US); Sivakumar Velusamy, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 321 days.

(21) Appl. No.: 11/389,348

(22) Filed: Mar. 24, 2006

(51) Int. Cl.
*G06F 17/50* (2006.01)
(52) U.S. Cl. .......................................... 703/14; 716/4
(58) Field of Classification Search .................. 703/16, 703/14
See application file for complete search history.

(56) References Cited

U.S. PATENT DOCUMENTS

| | | | | | |
|---|---|---|---|---|---|
| 5,787,245 | A | * | 7/1998 | You et al. | 714/38 |
| 6,052,524 | A | * | 4/2000 | Pauna | 703/22 |
| 6,053,947 | A | * | 4/2000 | Parson | 703/14 |
| 6,691,301 | B2 | * | 2/2004 | Bowen | 717/114 |
| 6,993,469 | B1 | * | 1/2006 | Bortfeld | 703/15 |
| 7,266,791 | B2 | * | 9/2007 | Morishita et al. | 716/4 |
| 7,346,903 | B2 | * | 3/2008 | Ball et al. | 717/162 |
| 2004/0117167 | A1 | * | 6/2004 | Neifert et al. | 703/14 |

OTHER PUBLICATIONS

Semeria et al, "Resolution, Optimization and Encoding of Pointer Variables for the Behavioral Synthesis from C", IEEE Transactions on Computer-Aided Design of Integrated Circuits and Systems, vol. 20, No. 2, Feb. 2001.*
Ghasemzadeh et al, "A Fast Cycle-Based Approach for Synthesizable RT Level VHDL Simulation", The 12th International Conference on Microelectronics, Oct. 31-Nov. 2, 2000.*
Ma et al, "Hybrid Simulation for IP-Based Design", IEIC Technical Report, vol. 99, No. 229, pp. 29-33, 1999.*
DeVane et al, "Efficient Circuit Partitioning to Extend Cycle Simulation Beyond Synchronous Circuits", 1997 IEEE/ACM International Conference on Computer-Aided Design, Digest of Technical Papers, pp. 154-161, Nov. 9-13, 1997.*
Rodrigues, Arun, "A Comparison of Serial Simulation Frameworks for Simulation of Computer Architectures", Computer Science and Engineering Technical Report TR 2004-32, Department of Computer Science and Engineering, University of Notre Dame, 2004.*
Mycroft et al, "Higher-level Techniques for Hardware Description and Synthesis", International Journal on Software Tools for Technology, vol. 4, No. 3, May 2002).*
U.S. Appl. No. 10/930,430, filed Aug. 31, 2004, Ganesan et al.

* cited by examiner

*Primary Examiner*—Kidest Bahta
*Assistant Examiner*—Mary C Jacob
(74) *Attorney, Agent, or Firm*—Kevin T. Cuenot; Lois D. Cartier

(57) ABSTRACT

A system for performing cycle accurate simulation of a circuit design can include a plurality of cycle accurate models, wherein each cycle accurate model is a software object representation of a hardware function, and a scheduler configured to execute each cycle accurate model at clock cycle boundaries determined during a simulation session.

20 Claims, 4 Drawing Sheets

FRAMEWORK FOR CYCLE ACCURATE SIMULATION

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

1. Field of the Invention

The present invention relates to the field of circuit design and, more particularly, to simulation and/or testing of circuit designs.

2. Description of the Related Art

Logic simulation refers to the prediction of the behavior of a digital system. Typically, logic simulation is performed using a software-based simulation tool, although it is not uncommon to incorporate hardware modules into simulation sessions. In any case, a logic simulation is performed based upon a description of the digital system in a hardware description language (HDL). The logic simulation may predict system operation by providing a time sequence of values for every output and every internal signal of the digital system when given a particular time sequence of values for the inputs of the digital system. The response of the digital system may be predicted for various input scenarios by respective logic simulations.

There are a variety of different simulation types in existence, each offering a set of advantages and disadvantages. One type of simulation is referred to as event driven simulation. Event driven simulation can provide a value for every signal of a digital system at every moment in time. As such, an event driven simulation provides a high level of detail relating to the operation of the simulated digital system. This detail means that a large amount of information is generated. In consequence, event driven simulations are characterized by slower execution speeds.

Another type of simulation is referred to as transaction level simulation. Transaction level simulation deals with high level transactions. Objects such as buses, for example, typically are tested using transaction level simulation. The simulation is structured in terms of transactions such as reads, writes, arbitration, etc. The simulation is conducted at a high level with no detail regarding the values of individual signals at each clock signal. Similarly, input/output also is tested using transaction level simulation where the simulation reflects input and output function calls rather than the detailed values available at I/O pins at each clock cycle. Accordingly, transaction level simulation provides less information than event driven simulation, but executes in less time.

As illustrated from the different types of simulation discussed above, typically there is a tradeoff between execution speed and the amount of information that is generated by a given type of simulation. Longer execution times mean that developers must wait longer periods of time before obtaining results for a given simulation scenario. It would be beneficial to provide a technique and/or system for simulating electronic circuits that overcomes the limitations described above.

SUMMARY

The present invention provides methods and articles of manufacture relating to simulation of a circuit design. One embodiment of the present invention can include a system for performing cycle accurate simulation of a circuit design. The system can include a plurality of cycle accurate models, where each cycle accurate model is a software object representation of a hardware function, and a scheduler configured to execute each cycle accurate model at clock cycle boundaries during a simulation session.

Each cycle accurate model can include a synchronous input function configured to evaluate synchronous inputs of the cycle accurate model, a synchronous output function configured to evaluate synchronous outputs of the cycle accurate model, and an asynchronous output function configured to evaluate asynchronous outputs of the cycle accurate model according to current input values. For each of the cycle accurate models, the scheduler can call the synchronous input function, the synchronous output function, and the asynchronous output function at least one time for each clock cycle that drives the cycle accurate model. The scheduler can call each synchronous input function, synchronous output function, and asynchronous output function for each cycle accurate model at least one time for each global clock cycle.

Each cycle accurate model also can include a synchronous input function, a synchronous output function, and an asynchronous output function for each clock signal that is provided to the cycle accurate model as an input. Additionally, each cycle accurate model can include at least three pointers. The first pointer can indicate ports of the cycle accurate model. The second pointer can indicate generics of the cycle accurate model. The third pointer can indicate registers of the cycle accurate model.

The scheduler can call the asynchronous output function of the cycle accurate model until the asynchronous output function indicates that no conflict exists. The system further can include an application programming interface through which a debugging system communicates with the scheduler. An input/output server also can be included that is configured to receive a connection request from an external system and identify one of the plurality of cycle accurate models from the connection request. The input/output server can establish a communication link between the external system and the identified cycle accurate model.

Another embodiment of the present invention can include a method of cycle accurate simulation for a circuit design. The method can include monitoring a current simulation time during a simulation session to identify individual clock cycles of a clock source, selecting cycle accurate models that are driven by the clock source, and executing the selected cycle accurate models on a per clock cycle basis.

The executing step can include calling a synchronous input function for each selected cycle accurate model, calling a synchronous output function for each selected cycle accurate model, and calling an asynchronous output function for each selected cycle accurate model. The synchronous input function, the synchronous output function, and the asynchronous output function for each selected cycle accurate model can be called at least one time for each global clock cycle during the simulation. One or more of the selected cycle accurate models can be driven by a plurality of clock signals. In that case, the executing step can include, for each selected cycle accurate model that is driven by a plurality of clock signals, calling a synchronous input function, a synchronous output function, and an asynchronous output function associated with one of the plurality of clock sources according to a current simulation time.

The method further can include identifying a conflict between a plurality of cycle accurate models, and, within a single simulation clock cycle, continuously calling an asynchronous output function for at least one cycle accurate model until no conflict exists.

The method also can include receiving a connection request from an external system, wherein the connection request specifies a target cycle accurate model, and establishing a connection with the target cycle accurate model wherein information is exchanged between the external system and the target cycle accurate model. The method also can include receiving simulation data from an external system and providing the simulation data to one of the cycle accurate simulation models for use during the simulation.

Yet another embodiment of the present invention can include a machine readable storage, having stored thereon a computer program having a plurality of code sections for causing a machine to perform the various steps and/or implement the components and/or structures disclosed herein.

BRIEF DESCRIPTION OF THE DRAWINGS

There are shown in the drawings, embodiments which are presently preferred, it being understood; however, that the invention is not limited to the precise arrangements and instrumentalities shown.

DETAILED DESCRIPTION OF THE INVENTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein provide a simulation environment, or framework, for use in simulating circuit designs, and particularly those that incorporate cycle accurate simulation models. In accordance with the embodiments disclosed herein, a hardware description of a circuit design can be processed to create a simulation environment for simulation of the circuit design. The simulation environment incorporates cycle accurate models which are coordinated through a scheduler, also included within the simulation environment. The framework executes simulations in a fast and efficient manner, while also providing information about the circuit design at the cycle level.

Figure 1:
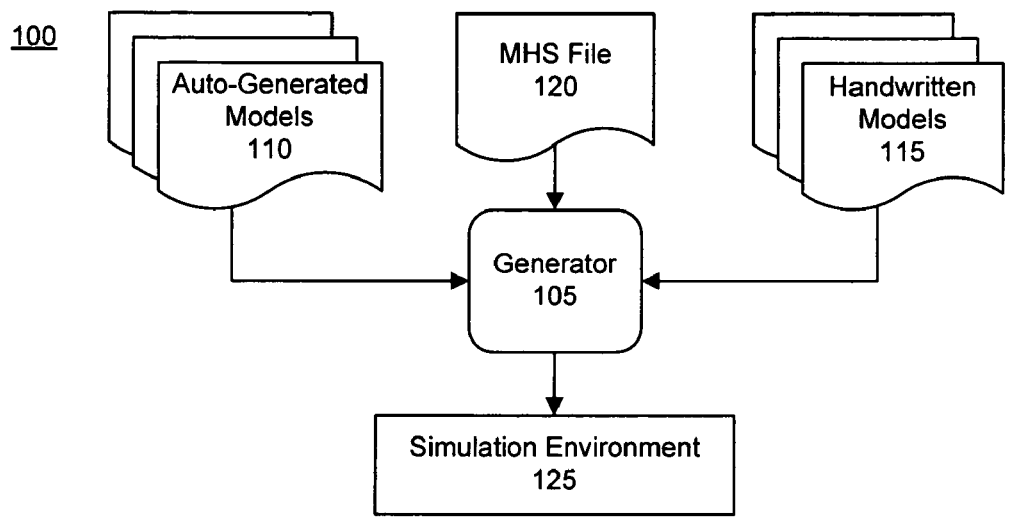
FIG. 1 is a block diagram illustrating a system which can create a simulation environment that supports cycle accurate simulation in accordance with one embodiment of the present invention.

FIG. 1 is a block diagram illustrating a system 100 which can create a simulation environment that supports cycle accurate simulation, also referred to as cycle-based simulation, in accordance with one embodiment of the present invention. As shown, system 100 can include a generator 105, which creates the simulation environment 125, also referred to as a framework for cycle accurate simulation. The generator 105 can create the simulation environment 125 from a Microprocessor Hardware Specification (MHS) file 120. As known, MHS file 120 describes the instantiation of components and the connectivity between the components of the circuit design and/or digital system that is to be simulated. As such, it should be appreciated that the generator 105 can create the simulation environment 125 from any of a variety of hardware description language (HDL) files or any other file that describes instantiations and connections.

In general, the generator 105 can process the MHS file 120 and identify cycle accurate models specified therein. Cycle accurate models can include models that are automatically generated using a tool, referred to as auto-generated models 110, as well as cycle accurate models that are coded manually, denoted as handwritten models 115. Cycle accurate models referenced by MHS file 120, whether auto-generated models 110 or handwritten models 115, can be copied into the simulation environment 125.

A cycle accurate model is a software program that represents the behavior and functionality of hardware. As its name suggests, a cycle accurate model reflects the state of inputs and outputs to the hardware represented by the model on a per clock cycle basis. Output is valid only at clock cycle boundaries. As such, operational details of the modeled hardware that occur between clock cycle boundaries, i.e. between leading and/or trailing edges, depending upon when the model is clocked, are not reflected by the model. Cycle-based simulation may provide, with improved execution speed, a value for every signal of a synchronous digital system, but only at clock cycle boundaries.

Each of the cycle accurate models incorporated into the simulation environment 125 must adhere to several different requirements. One requirement is that each cycle accurate model is to include at least three different pointers. The first pointer provides a reference to the ports of the model. The second pointer provides a reference to the generics of the model. As known, the value of a generic can be supplied externally, for example in a component instantiation statement or in a configuration specification. The third pointer provides a reference to the registers of the model.

Another requirement is that each cycle accurate model further is to provide a function that evaluates synchronous inputs to the model (synchronous input function), a function that updates synchronous outputs to the model (synchronous output function), as well as a function that evaluates and updates asynchronous outputs of the model (asynchronous output function). Thus, for each clock cycle of a logic simulation for a given clock domain, each function for evaluating synchronous inputs, synchronous outputs, and asynchronous outputs of models contained within that clock domain can be called. For each clock cycle of a logic simulation, each function can be called to produce output values and register update values for the next clock cycle based upon values for the registers and inputs for the current clock cycle.

As used herein, a clock domain refers to a portion of a circuit design that is clocked using a common clock signal. Different clock domains can use different clock signals to drive the components included therein, whether such signals are generated by different clock sources, are phase shifted versions of another clock signal, or are multiples of another clock signal. Further detail regarding cycle accurate models is provided in U.S. Pat. No. 7,131,091, entitled "Generating Fast Logic Simulation Models for a PLD Design Description," U.S. Pat. No. 7,131,091 is assigned to Xilinx Inc. of San Jose, Calif. and is hereby incorporated by reference.

Figure 2:
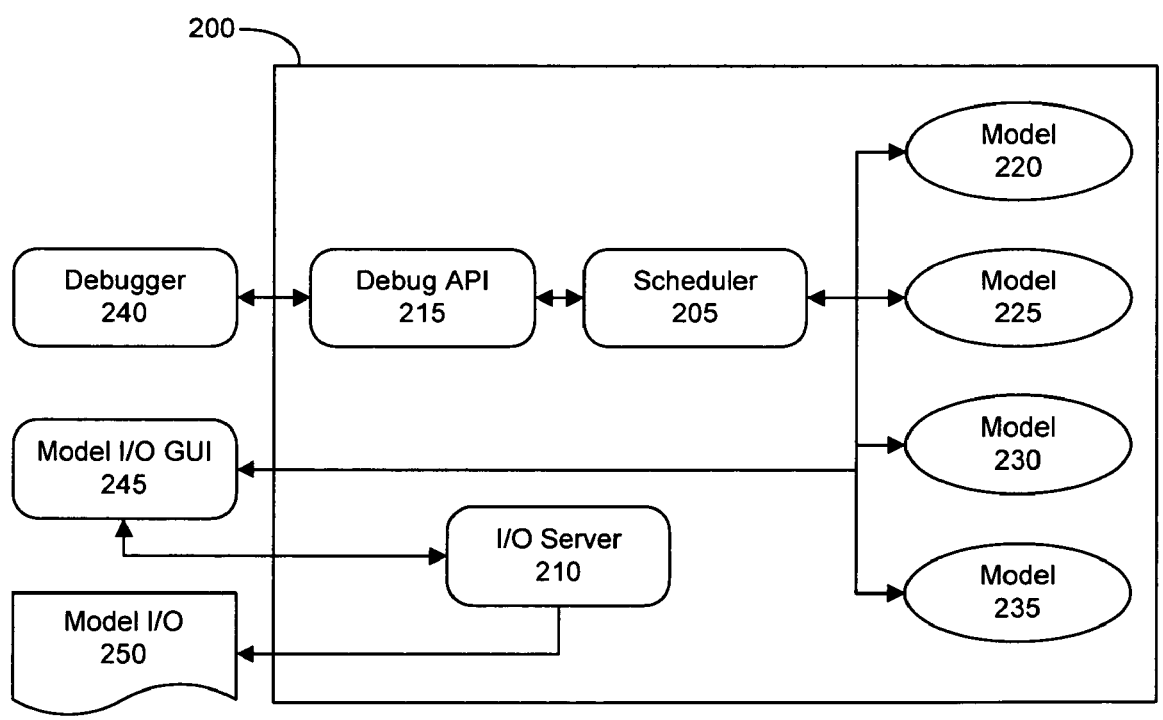
FIG. 2 is a block diagram illustrating a simulation environment that supports cycle accurate simulation in accordance with another embodiment of the present invention.

FIG. 2 is a block diagram illustrating a simulation environment 200, or framework, that supports cycle accurate simulation in accordance with another embodiment of the present invention. Framework 200 can be created using the generator illustrated with reference to FIG. 1. As shown, framework 200 can include a scheduler 205, an input/output (I/O) server 210, and a debug application programming interface (API) 215. Framework 200 further can include a plurality of cycle accurate models denoted as models 220, 225, 230, and 235. It should be appreciated that framework 200 can include more or fewer models according to the particular digital system being simulated. Accordingly, the number of models depicted in FIG. 2 is not intended to be a limitation of the present invention.

The scheduler 205 coordinates the operation or execution of the various models 220-235 according to the current simulation time as a simulation progresses or executes. The scheduler 205 further tracks the exact times of positive and negative edges of various clock signals provided to the simulated circuit design. The scheduler 205 can coordinate the operation of models 220-235 despite whether one or more of the models exist in different clock domains.

The I/O server 210 is configured to accept connections from one or more model I/O components such as model I/O GUI 245 and model I/O 250. The I/O server 210 then can establish a communication link directly between the different ones of the models 220-235 and the model I/O GUI 245 and/or the model I/O 250. That is, the I/O server 210 can receive a request for a connection to a particular model from the model I/O GUI 245 and establish a connection directly with the model specified by the request. Once the communication link is established via the I/O server 210, simulation information can be passed to and from the model and the I/O GUI 245 directly without intervention by the I/O server 210. It should be appreciated that the I/O server 210 can support connections with multiple models simultaneously.

The model I/O GUI 245 is a GUI that is configured to present simulation data for one of the models to a user. As such, the I/O GUI 245 can present input data to the corresponding model as well as output data generated by the model. Simulation data, whether input or output data for the model, can be displayed in any of a variety of different visual forms depending upon the particular characteristics of the model I/O GUI 245 itself. The I/O server 210, however, also can provide simulation data from a selected model in other formats, i.e. such as a text document or the like, referred to as model I/O 250.

The framework 200 further can include a debug API 215 through which one or more conforming analysis and/or debug tools, i.e. debugger 240, can communicate with the framework 200. In one embodiment, for example, the debug API 215 provides the necessary functionality for a tool such as the Xilinx Microprocessor Debugger, also referred to as XMD, which is commercially available from Xilinx, Inc. of San Jose, Calif., to interface with the simulation environment 200. XMD is a debug engine for use with embedded systems. In any case, the debugger 240 can control execution of the framework 200 via the debug API 215. In illustration, the debugger 240 allows a developer to access internal registers of the models 220-235 as well as memory locations of the models. Further, through the debugger 240, a developer and/or test engineer can access memory mapped registers of the models 220-235.

It should be appreciated that XMD is offered as one example of a debugging system that can be used with the embodiments disclosed herein. The present invention, however, is not intended to be limited to one particular type of debugger, and as such, can communicate with any of a variety of different software-based debugging and/or analysis tools that are capable of communicating via debug API 215.

Figure 3:
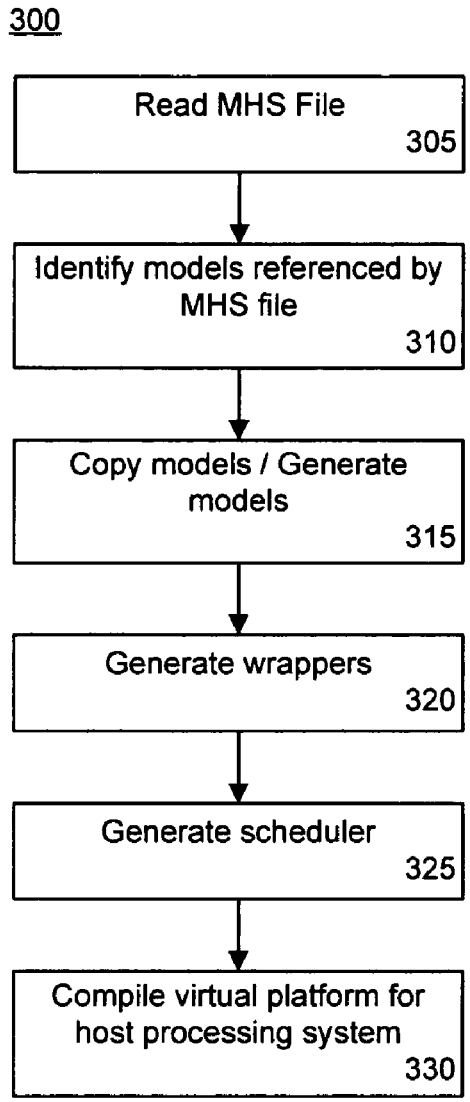
FIG. 3 is a flow chart illustrating a method of creating a cycle accurate simulation environment in accordance with another embodiment of the present invention.

FIG. 3 is a flow chart illustrating a method 300 of creating a cycle accurate simulation environment in accordance with another embodiment of the present invention. The method 300 can be performed by the generator discussed with reference to FIG. 1. In step 305, the debugger can read the MHS file corresponding to a particular circuit or digital design. In step 310, the various cycle accurate models specified by the MHS file can be identified.

In step 315, the generator can copy any identified models that exist. The model copies can be subsequently incorporated into the simulation environment, or framework, that is generated. Further, if necessary, cycle accurate models can be automatically generated and incorporated into the framework. In step 320, the generator creates the wrappers as may be required. A wrapper is needed for each model that is created by the generator. Handwritten or manually created models do not require a wrapper. Such is the case because if a particular model is instantiated multiple times and each instance is configured differently through the use of different generics, the configured instance of the model is treated as a unique component that is different from other instances of the same model. In the case of a manually created model, the wrapper is not required since the model is expected to properly handle configuration through generics and behave differently for each instance based on the value of the generic(s).

In any case, in step 325, the scheduler is created. In step 330, the aforementioned components are compiled into machine code and linked into a single executable file for use on a particular host processing system.

Figure 4:
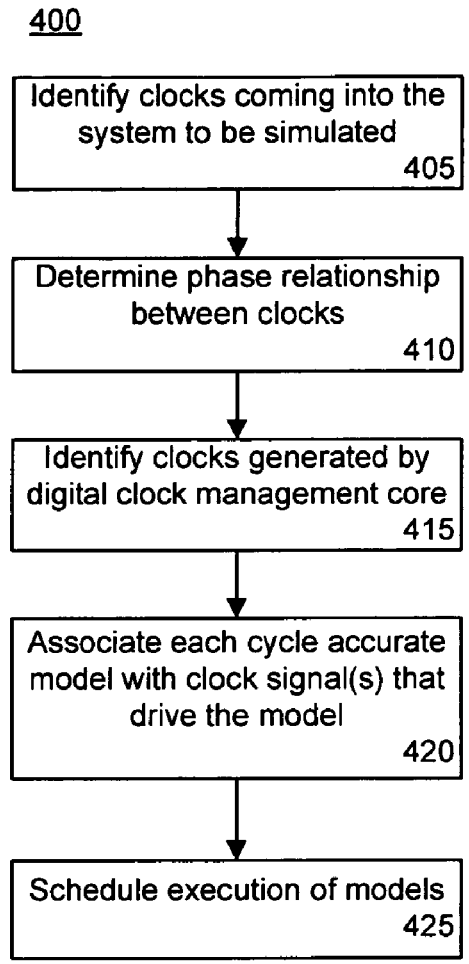
FIG. 4 is a flow chart illustrating a method of creating a scheduler in accordance with another embodiment of the present invention.

FIG. 4 is a flow chart illustrating a method 400 of creating a scheduler in accordance with another embodiment of the present invention. Method 400 presents a more detailed method of implementing the scheduler which corresponds to step 325 of FIG. 3. Accordingly, in step 405, the generator can process the MHS file to identify the clock sources that come into, or are used by, the system being simulated. In step 410, the generator determines the phase relationships between the various clock sources of the MHS file.

In step 415, clocks generated by the digital clock management core can be identified. A digital clock manager core is a circuit design primitive that is capable of implementing functions such as a clock delay locked loop, a digital frequency synthesizer, digital phase shifter, and a digital spread spectrum. In step 420, each cycle accurate model can be associated with the particular clock signal used to drive that model. It should be appreciated that cycle accurate models can be driven by more than one clock signal.

In step 425, the generator schedules the execution of the cycle accurate models. That is, the generator creates the code of the scheduler which is responsible for calling the appropriate models according to the current simulation time and the particular clock cycle boundaries occurring on the current simulation time during a simulation session. A scheduler is created for each circuit design to be simulated. That is, the scheduler for one circuit design differs from that of another as the particular models that must be executed on a given clock cycle differ from one design to another. As noted, the scheduling of cycle accurate models can be performed across multiple clock domains.

Within step 425, a top level file written in a high level programming language such as C or C++ can be generated. The top level file, when compiled, implements the scheduler. In addition to effectively scheduling execution of the models, which will be described in greater detail with reference to FIGS. 5 and 6, the scheduler can specify variables which serve to connect signals between various models of the design. In one embodiment, the top level file can specify a variable for each signal of the circuit design to be simulated. In illustration, if output from model A is provided as input to model B, a corresponding variable can be defined within the top level file for storing that signal during simulation. During simulation, model A can write to this variable, which is maintained within the scheduler, and model B can read from the variable. Once the top level file is created, it can be compiled for inclusion in the simulation environment as the scheduler.

Figure 5:
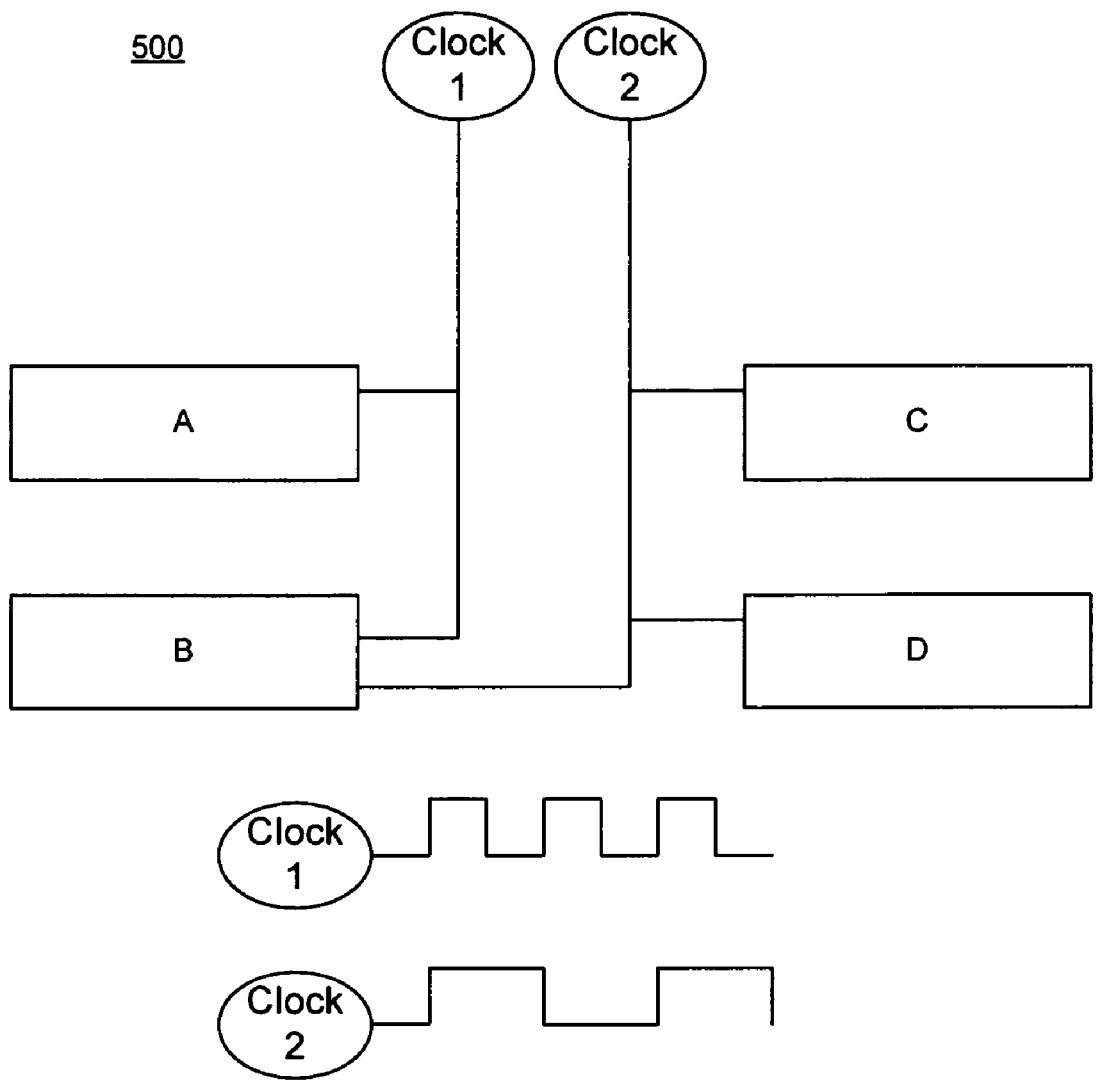
FIG. 5 is a block diagram illustrating a digital system which can be simulated as described herein.

FIG. 5 is a block diagram illustrating a digital system 500 which can be simulated as described herein. As shown, digital system 500 includes components A, B, C, and D as well as two different clocks 1 and 2. Clock 1 drives components A and B, while clock 2 drives components B, C, and D. Table 1 below shows exemplary code that can be generated as part of the scheduler to call the various functions for cycle accurate models representing components driven by clock 1.

TABLE 1

Example of Scheduler Code

```
/* While simulation time has not ended */
    while (vp_time < end_time) {
        /* Call the "Evaluate Synchronous Inputs" function for all
models connected to Clock1 */
        Clock1_Model1_EvalSyncInputs( );
        Clock1_Model2_EvalSyncInputs( );
        Clock1_Model3_EvalSyncInputs( );
        /* Call the "Update Synchrounous Outputs" function for all
models connected to Clock1 */
        Clock1_Model1_UpdateSyncOutputs( );
        Clock1_Model2_UpdateSyncOutputs( );
        Clock1_Model3_UpdateSyncOutputs( );
        /* Call the Evaluate Asynchronous Outputs" function for ALL
        models */
        loop = 0;
        while (!loop) {
          loop = Model1_EvalAsyncOutputs( ) &
              Model2_EvalAsyncOutputs( ) &
              Model3_EvalAsyncOutputs( );
        }
        /* Increment the time */
    ...
        /* Repeat what was done, but for the all the remaining clocks */
    ...
    }
```

In the example code provided in Table 1, the EvalSynchInputs functions are called, then the UpdateSynchOutputs functions. The EvalAsynchOutputs functions are called in a loop until the value returned by each is 1. If one of the EvalAsynchOutputs functions returns a 0, the value changed for that function. Accordingly, each of the EvalAsynchOutputs functions are called again. This accounts for data dependencies among different cycle accurate models. Further, as illustrated by component B, each component that is driven by more than one clock signal can provide a synchronous input function, a synchronous output function, as well as an asynchronous output function to be called for each clock signal. Accordingly, as indicated by the comment in the example code above, the process illustrated in Table 1 can be repeated for each remaining clock, in this case clock 2.

The clock signals of the system have a fixed timing relationship. A least common multiple of the clock periods, for example, can be used to generate a time interface function with a call to the respective evaluate and update functions for each clock signal in the order that the clock signal transitions occur in operation of the circuit design. For transitions of multiple clock signals occurring simultaneously, the evaluate functions for all the multiple clock signals can be called before calling the corresponding update functions.

Figure 6:
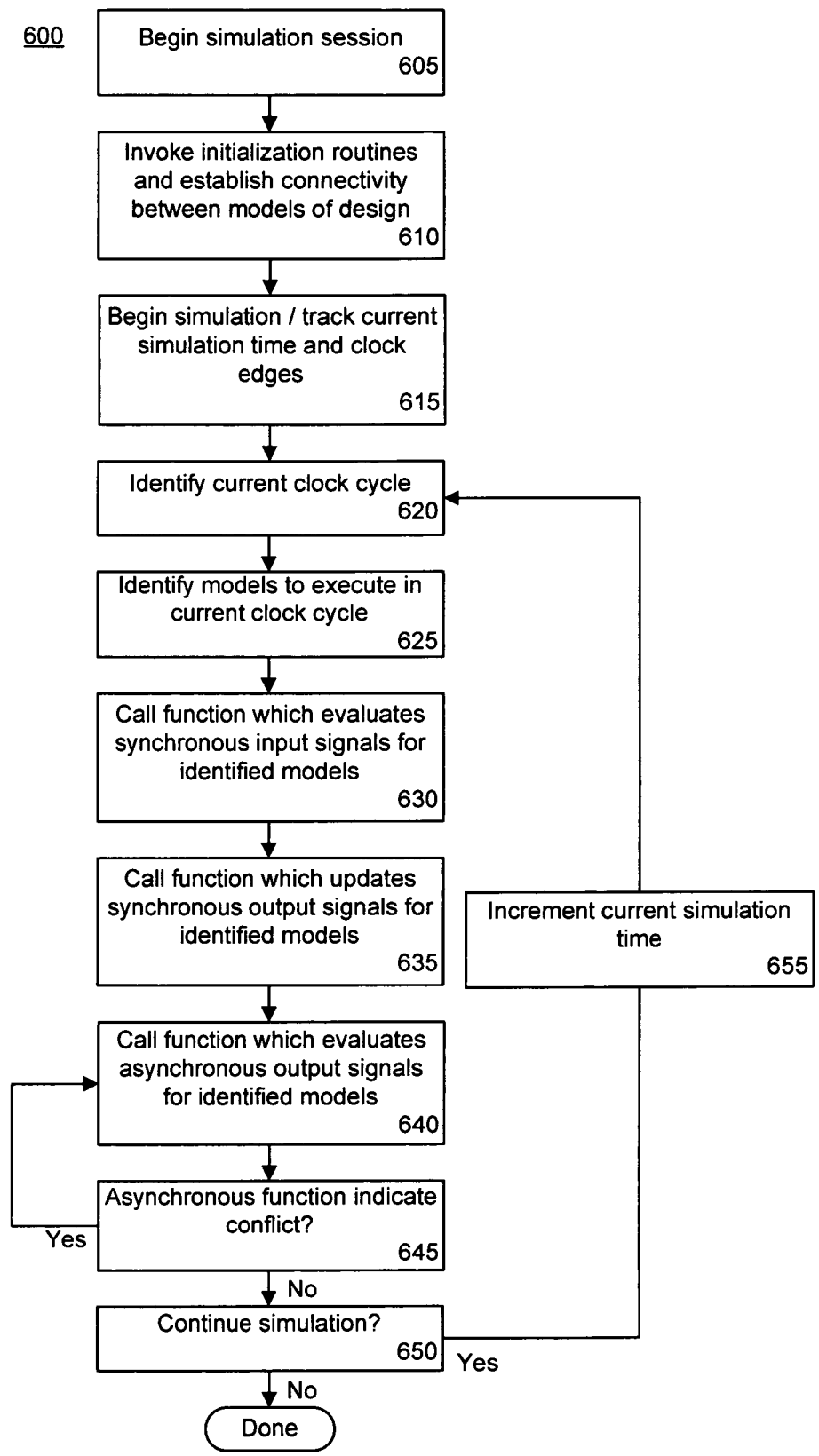
FIG. 6 is a flow chart illustrating a method of cycle accurate simulation of a circuit design in accordance with yet another embodiment of the present invention.

FIG. 6 is a flow chart illustrating a method 600 of cycle accurate simulation of a circuit design in accordance with another embodiment of the present invention. More particularly, method 600 illustrates a method of operation for the scheduler and the manner in which cycle accurate models are executed during a simulation session. Accordingly, method 600 can begin in a state where a framework has been created as described herein. In step 605, the simulation session can begin by executing the framework. In step 610, one or more initialization routines can be executed. The scheduler can invoke one or more predetermined initialization routines for each cycle accurate model included in the framework. It should be appreciated that each model can include its own initialization routine(s) which can be referenced or called by the scheduler. The scheduler can be configured to call such initialization routines as the models to be used within a given simulation session are known when the scheduler is generated. During initialization, the scheduler can establish connectivity among the different models and connect the various ports of the models as specified by the MHS file.

In step 615, the simulation, and particularly, execution of the models, can be started. Accordingly, the scheduler begins to track the current simulation time for the simulation session. The scheduler can maintain the current simulation time. This time is advanced as the simulation continues to execute and is incremented by a predetermined unit of time, i.e., a least common multiple of the clock periods of the system being simulated. Thus, the scheduler can determine whether the current time corresponds to any leading and/or trailing clock edges for clock signals distributed within the system being simulated. In step 620, a clock cycle for one or more of the system clocks can be identified. The current clock cycle, i.e. a leading or trailing edge of a clock signal, can correspond to any of a plurality of different clock signals which has been determined by the scheduler to occur within the simulation at the current simulation time.

In step 625, the scheduler identifies the models that are to execute for the current clock cycle. Not every cycle accurate model may be controlled or clocked by the same clock signal. Accordingly, the current clock cycle may only pertain to a limited number of cycle accurate models. In that case, only those cycle accurate model that are clocked by the current clock cycle can be executed. Still, it should be appreciated that each cycle accurate model is executed at least one time for each global clock cycle.

In step 630, the synchronous input function for each cycle accurate model identified in step 625 can be called. When a cycle accurate model is executed, i.e. its input and output functions called, the model can access the compiled top level file incorporated into the scheduler and simulation environment to determine the proper variable from which to read input and to which output is to be written. As noted, writing and/or reading from the correct variable for a given signal facilitates connectivity among models in the circuit design. In step 635, the synchronous output function for each cycle accurate model identified in step 625 can be called. In step 640, the asynchronous output function for each cycle accurate model identified in step 625 can be called.

Accordingly, in step 645, a determination can be made as to whether the asynchronous output function for each of the cycle accurate models identified in step 625 indicates a conflict, i.e. with respect to data dependencies between the models. If no conflict exists, the method can proceed to step 650. If a conflict does exist, in one embodiment the method can loop back to step 640 to continue calling the asynchronous output function(s) of each model for which a conflict has been identified until such time that no conflict is detected for the model(s). This loop, i.e., steps 640-645, can be performed continuously for a single simulation clock cycle.

To better illustrate a conflict scenario, consider the case where two models, denoted as A and B, have asynchronous logic and that model A has inputs which are dependent on an output of model B. In that case, the scheduler will connect output of model B to the input of model A, i.e. model B writes output data to a variable from which model A reads input data. Since the order in which the scheduler calls the functions does not matter, an evaluation must be performed as to whether the values change. For example, within a single clock cycle, the scheduler calls the asynchronous output functions for models A and B in that order and both functions calculate new output values.

Each model A and B can be configured to evaluate whether the value computed by its asynchronous output function changed from a prior value. Thus, if the output value of model B changed from the previous call, the output value of model A is incorrect. Such is the case as the input to model A depends upon the output of model B. Here, model A executed using an old and incorrect output value from model B, i.e. from a previous call. Accordingly, the value of the output for model A must be calculated again using the correct input value from model B. In one embodiment, the synchronous output function of model A is called until such time that a same value is returned two consecutive times in a given simulation clock cycle. In another embodiment, each asynchronous output function can be called, i.e. for both models A and B.

If, however, the output value produced by model B is not different from the prior output value, there is no need to call model A again because the value is already correct. In any case, the loop can continue until no new values are calculated by the asynchronous output function for any model in a given simulation clock cycle. Though described with reference to only two models, it should be appreciated that the methodology can be extrapolated to N number of models with any number of dependencies between the models. It should be appreciated that it is the models themselves that return a conflict indication or flag to the scheduler and that the scheduler does not track such data dependencies. Accordingly, the scheduler continues to call the asynchronous output function for each cycle accurate model indicating such a conflict, or for all models, until such the conflict is resolved.

Though not shown, the scheduler also can count the number of times in which an asynchronous output function for each model is called for a same simulation clock cycle. If the count exceeds a predetermined value, an indication can be provided that an oscillation between two or more models has been detected and the method can end or exit. An oscillation typically indicates a problem or error in a circuit design.

In step 650, a determination can be made as to whether the simulation is finished, i.e. whether the simulation has run for a predetermined number of clock cycles or has encountered a break point. If so, the method can end. If not, however, the method can loop back to step 620 by way of step 655 where the current simulation time is incremented. After step 655, the simulation can continue to execute.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically, i.e. communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A system for performing cycle accurate simulation of a circuit design comprising:
   a computer executing program code, wherein the computer:
   identifies a plurality of cycle accurate models, wherein each cycle accurate model is a software object representation of a hardware function;
   executes a scheduler, wherein the scheduler:
   executes each said cycle accurate model at clock cycle boundaries during a simulation session in an order that is independent of dependencies among individual ones of the plurality of cycle accurate models;

first determines, during the cycle accurate simulation, whether at least one of the plurality of cycle accurate models indicates a conflict relating to execution order between at least two of the plurality of cycle accurate models according to whether each cycle accurate model returns a flag, wherein the scheduler does not track data dependencies among cycle accurate models other than identifying whether a flag is returned in consequence of executing the plurality of cycle accurate models; and calls an asynchronous output function of each of the plurality of cycle accurate models for a selected clock cycle boundary of the simulation until each asynchronous output function indicates that no conflict exists.

2. The system of claim 1, wherein each said cycle accurate model further comprises:

a synchronous input function configured to evaluate synchronous inputs of said cycle accurate model according to current input values; and a synchronous output function configured to evaluate synchronous outputs of said cycle accurate model according to current input values.

3. The system of claim 2, wherein, for each said cycle accurate model, said scheduler calls said synchronous input function, said synchronous output function, and said asynchronous output function at least one time for each clock cycle that drives said cycle accurate model.

4. The system of claim 2, wherein said scheduler calls each said synchronous input function, synchronous output function, and asynchronous output function of each said cycle accurate model at least one time for each global clock cycle.

5. The system of claim 2, wherein each said cycle accurate model comprises a synchronous input function, a synchronous output function, and an asynchronous output function for each clock signal that is provided to said cycle accurate model as an input.

6. The system of claim 1, wherein each said cycle accurate model further comprises at least three pointers, wherein a first of said pointers indicates ports of said cycle accurate model, a second of said pointers indicates generics of said cycle accurate model, and a third of said pointers indicates registers of said cycle accurate model.

7. The system of claim 1, further comprising an application programming interface through which a debugging system communicates with said scheduler.

8. The system of claim 1, further comprising:

an input/output server receiving a connection request from an external system;

identifying one of said plurality of cycle accurate models from the connection request; and establishing a communication link between said external system and said identified cycle accurate model, wherein responsive to establishing the communication link, the external system communicates with the identified cycle accurate model over the communication link directly without intervention of the input/output server.

9. A computer-implemented method of cycle accurate simulation for a circuit design, said method comprising:

monitoring a current simulation time during a simulation session to identify individual clock cycles of a clock source;

selecting cycle accurate models that are driven by the clock source;

executing the selected cycle accurate models on a per clock cycle basis in an order that is independent of dependencies among individual ones of the selected cycle accurate models;

first identifying a conflict between a plurality of the selected cycle accurate models during simulation at a selected clock cycle according to whether a flag is generated by execution of at least one of the plurality of selected cycle accurate models; and within the selected simulation clock cycle, continuously calling an asynchronous output function for at least one of the plurality of selected cycle accurate models until no conflict exists.

10. The method of claim 9, said executing step further comprising:

calling a synchronous input function for each selected cycle accurate model; and calling a synchronous output function for each selected cycle accurate model, wherein the synchronous input function, the synchronous output function, and the asynchronous output function of each cycle accurate model are called at least one time for each global clock cycle during the simulation.

11. The method of claim 9, wherein at least one of the selected cycle accurate models is driven by a plurality of clock signals, said executing step comprising, for each selected cycle accurate model that is driven by a plurality of clock signals, calling a synchronous input function, a synchronous output function, and an asynchronous output function associated with one of the plurality of clock sources according to a current simulation time.

12. The method of claim 9, further comprising:

receiving, within an input/output server, a connection request from an external system, wherein the connection request specifies a target cycle accurate model; and the input/output server establishing a connection between the external system and the target cycle accurate model wherein, responsive to establishing the connection, information is exchanged between the external system and the target cycle accurate model over the connection directly without intervention of the input/output server.

13. The method of claim 9, further comprising:

receiving simulation data from an external system; and providing the simulation data to one of the cycle accurate simulation models for use during the simulation.

14. A machine readable storage, having stored thereon a computer program having a plurality of code sections that, when executed by a computer, cause the computer to perform a plurality of steps, said machine readable storage comprising:

code for monitoring a current simulation time during a simulation session to identify individual clock cycles of a clock source;

code for selecting cycle accurate models that are driven by the clock source;

code for executing the selected cycle accurate models on a per clock cycle basis in an order that is independent of dependencies among individual ones of the selected cycle accurate models;

code for first identifying a conflict between a plurality of the selected cycle accurate models during simulation at a selected clock cycle according to whether a flag is generated by execution of at least one of the plurality of cycle accurate models; and code for, within the selected simulation clock cycle, continuously calling an asynchronous output function for at least one of the plurality of selected cycle accurate models until no conflict exists.

15. The machine readable storage of claim 14, said code for executing further comprising:
    code for calling a synchronous input function for each selected cycle accurate model; and
    code for calling a synchronous output function for each selected cycle accurate model,
    wherein the synchronous input function, the synchronous output function, and the asynchronous output function for each cycle accurate model are called at least one time for each global clock cycle during the simulation.

16. The machine readable storage of claim 14, wherein at least one of the selected cycle accurate models is driven by a plurality of clock signals, said code for executing further comprising, code for, for each selected cycle accurate model that is driven by a plurality of clock signals, calling a synchronous input function, a synchronous output function, and an asynchronous output function associated with one of the plurality of clock sources according to a current simulation time.

17. The machine readable storage of claim 14, further comprising:
    code for receiving a connection request, within an input/output server, from an external system, wherein the connection request specifies a target cycle accurate model; and
    code for the input/output server establishing a connection with the target cycle accurate model wherein, responsive to establishing the connection, information is exchanged between the external system and the target cycle accurate model over the connection directly without intervention of the input/output server.

18. The system of claim 1, wherein the computer stores a compiled top level file as part of the scheduler, wherein the top level file comprises a plurality of variables and each of the plurality of variables represents a signal of the circuit design, wherein connectivity of a first cycle accurate model with a second cycle accurate model comprises the first cycle accurate model writing to a selected variable of the top level file and the second cycle accurate model reading from the selected variable of the top level file.

19. The method of claim 9, further comprising storing a compiled top level file as part of the scheduler, wherein the top level file comprises a plurality of variables and each of the plurality of variables represents a signal of the circuit design, wherein connectivity of a first cycle accurate model with a second cycle accurate model comprises the first cycle accurate model writing to a selected variable of the top level file and the second cycle accurate model reading from the selected variable of the top level file.

20. The machine readable storage of claim 14, further comprising code that stores a compiled top level file as part of the scheduler, wherein the top level file comprises a plurality of variables and each of the plurality of variables represents a signal of the circuit design, wherein connectivity of a first cycle accurate model with a second cycle accurate model comprises the first cycle accurate model writing to a selected variable of the top level file and the second cycle accurate model reading from the selected variable of the top level file.

* * * * *